United States Patent
Imura et al.

(10) Patent No.: US 9,917,055 B2
(45) Date of Patent: Mar. 13, 2018

(54) SEMICONDUCTOR DEVICE HAVING FUSE ELEMENT

(71) Applicant: SII Semiconductor Corporation, Chiba-shi, Chiba (JP)

(72) Inventors: Yukihiro Imura, Chiba (JP); Yoshitaka Kimura, Chiba (JP); Masaru Akino, Chiba (JP)

(73) Assignee: SII Semiconductor Corporation (JP)

( * ) Notice: Subject to any disclaimer, the term of this patent is extended or adjusted under 35 U.S.C. 154(b) by 26 days.

(21) Appl. No.: 15/065,954

(22) Filed: Mar. 10, 2016

(65) Prior Publication Data
US 2016/0268196 A1    Sep. 15, 2016

(30) Foreign Application Priority Data

Mar. 12, 2015  (JP) ................................ 2015-049781
Jan. 18, 2016  (JP) ................................ 2016-007337

(51) Int. Cl.
*H01L 23/52* (2006.01)
*H01L 23/525* (2006.01)
*H01L 23/00* (2006.01)

(52) U.S. Cl.
CPC ........ *H01L 23/5258* (2013.01); *H01L 23/564* (2013.01)

(58) Field of Classification Search
CPC ......... H01L 2924/0002; H01L 23/5258; H01L 23/564
USPC ...................................................... 257/529
See application file for complete search history.

(56) References Cited

U.S. PATENT DOCUMENTS

| | | | | |
|---|---|---|---|---|
| 7,041,514 B1* | 5/2006 | Vrijen | ..................... | H01L 22/22 257/48 |
| 8,324,708 B2* | 12/2012 | Minami | .............. | H01L 23/5258 257/529 |
| 2004/0080022 A1* | 4/2004 | Ido | ...................... | H01L 23/5258 257/529 |
| 2005/0118782 A1* | 6/2005 | Kim | .................. | H01L 21/02129 438/409 |
| 2014/0210042 A1* | 7/2014 | Hasegawa | ........... | H01L 23/5258 257/529 |

OTHER PUBLICATIONS

NPL Machine Translation JP 2011-049252.*
Abstract, Publication No. JP 2011-049252, Publication date Mar. 10, 2011.

* cited by examiner

*Primary Examiner* — Trung Q Dang
*Assistant Examiner* — Patricia Reddington
(74) *Attorney, Agent, or Firm* — Klintworth & Rozenblat IP LLP; Bruce L. Adams

(57) ABSTRACT

A corrosion-resistant semiconductor device includes fuse elements that can be cut by laser light. An upper portion of the fuse elements is covered with a porous insulating film so that, when laser light irradiated from a rear surface of a semiconductor substrate is collected at selected fuse elements, the fuse elements generate heat, expand, and rupture. An array of intersecting metal lines forming windows is disposed over the fuse elements to permit rapid expansion of the fuse elements when irradiated with the laser light. A silicon nitride film having a uniform thickness is formed on a front surface of the semiconductor device to prevent entry of moisture.

19 Claims, 4 Drawing Sheets

SEMICONDUCTOR DEVICE HAVING FUSE ELEMENT

BACKGROUND OF THE INVENTION

1. Field of the Invention

The present invention relates to a semiconductor device, and more particularly, to a semiconductor device including a fuse element that can be cut for changing a circuit configuration of the semiconductor device, and to a method of manufacturing the semiconductor device.

2. Description of the Related Art

In manufacturing a semiconductor device, after a wafer manufacturing process called a front-end process is finished, there is a process of changing a circuit configuration of a semiconductor device by cutting a fuse element formed of, for example, polysilicon or metal by using, for example, a laser, which occupies part of a back-end process. In this process, a resistance value can be corrected to obtain desired characteristics after electrical characteristics of the semiconductor device are measured. This process is thus an effective manufacturing process particularly for semiconductor devices that place emphasis on their analog characteristics.

In this process, it is required for the fuse element to be stably cut by the laser and have a high corrosion resistance. Hitherto, an insulating protective film is formed on an upper portion of a semiconductor device, and, for example, a silicon nitride film is used for the purpose of preventing moisture from coming in from the outside and other purposes. However, a fuse element is assumed to be cut later by laser radiation, and thus, a sufficiently thick silicon nitride film cannot be formed thereon. This is because a silicon nitride film is mechanically robust and is not easily broken by laser radiation simultaneously with the fuse element. Therefore, in general, a protective film above the fuse element is removed, and thus, the protective film opens above the fuse element. Further, an insulating film under the protective film is removed as well so as to have a desired thickness suitable for cutting the fuse element, and thus, only an insulating film that is mainly an oxide film for separating the metal line layer slightly remains on the fuse element. The fuse element is liable to be affected by incoming moisture, and it is necessary to improve corrosion resistance thereof.

In Japanese Patent Application Laid-open No. 2011-49252, there is proposed a method of improving a corrosion resistance by forming a moisture resistance insulating film such as a silicon nitride film or a silicon oxynitride film on at least a side surface of a fuse element, or on the side surface and an upper portion of the fuse element in such a manner that the moisture resistance insulating film is thinner on the upper portion than on the side surface.

However, the above-mentioned related art has the following problems. Although moisture basically enters from a portion above the fuse element from which the protective film is removed, in the method, no moisture resistance insulating film is formed or the thin moisture resistance insulating film is formed on the upper portion of the fuse element. Therefore, the protection of the upper portion is insufficient. Further the use of the silicon nitride film or the silicon oxynitride film as the moisture-resistant insulating film results in a strict condition for the fuse element cutting because the radiated laser beam is absorbed by the film. In this method, the moisture resistance improvement and the stability of cutting the fuse element by the laser have a trade-off relationship, and hence obtaining conditions that satisfy both the requirements are difficult to achieve. This is because the related-art configuration focuses only on an uncut fuse element and has no effect on a fuse element cut by the laser. When the fuse element is cut, the fuse element is exposed from the cut surface to cause corrosion. The fuse element is corroded from the cut surface and the fuse element thus expands, resulting in cracking of the insulating film formed on the fuse element. Further, a problem arises in that the crack becomes an entering route of the moisture, and hence the corrosion progresses inside the semiconductor device.

SUMMARY OF THE INVENTION

The present invention has been made in view of the above-mentioned problems, and provides a semiconductor device including a fuse element that prevents progress of corrosion from a cut portion of the fuse element.

In order to solve the problems described above, according to one embodiment of the present invention, an opening region is not formed on a fuse element, a front surface of a semiconductor device is covered with a silicon nitride film having a uniform thickness, and a porous insulating film is formed under the silicon nitride film. Further, laser light can be radiated from a rear surface of a semiconductor substrate forming the semiconductor device and the laser light can be collected at the fuse element formed on an oxide film formed on a front surface of the semiconductor substrate, thereby cutting the fuse element.

According to the one embodiment of the present invention, the fuse element remains covered with the silicon nitride film serving as a protective film after being cut. Thus, the fuse element is not exposed, and there is almost no possibility that the fuse element is corroded. A semiconductor device having a fuse element can be provided that inhibits appearance of a new path of incoming moisture and that does not incur corrosion due to moisture coming in the semiconductor device.

BRIEF DESCRIPTION OF THE DRAWINGS

FIGS. 1A and 1B are an illustration of a semiconductor device according to a first embodiment of the present invention, in which FIG. 1A is a plan view and FIG. 1B is a sectional view taken along the line A-A of FIG. 1A.

DETAILED DESCRIPTION OF THE INVENTION

Now, various embodiments of the present invention are described with reference to the drawings.

First Embodiment

Figure 1A:
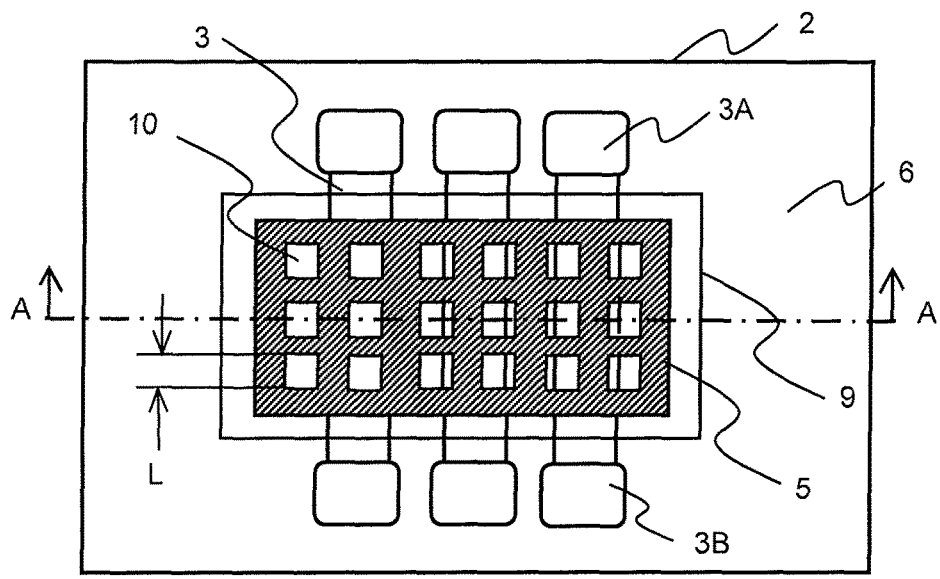
Figure 1B:
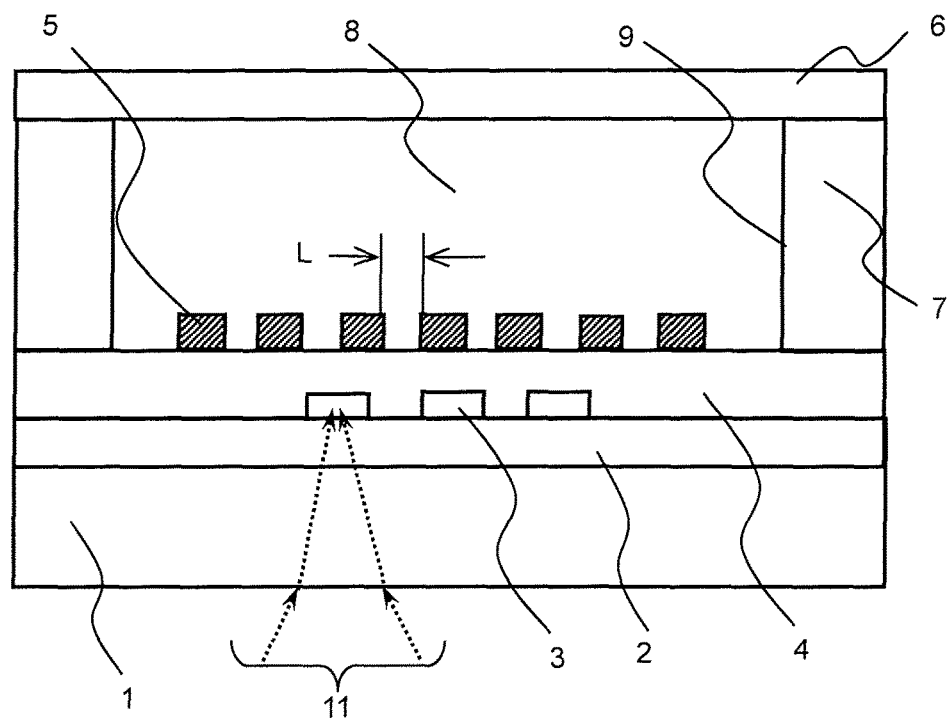

FIG. 1 is an illustration of a semiconductor device according to a first embodiment of the present invention, in which FIG. 1A is a plan view and FIG. 1B is a sectional view taken along the line A-A of FIG. 1A.

As illustrated in FIG. 1A, a plurality of fuse elements 3 are arranged side by side on a field oxide film 2. One end of the fuse element 3 is a terminal 3a and another end of the fuse element is a terminal 3b. Each of the fuse elements 3 is connected to a circuit via the terminals. The circuit is configured to determine whether or not a current passes between the terminals 3a and 3b. A dimension of the fuse element 3 in a direction perpendicular to a direction of a current passing through the fuse element 3 is herein referred to as a width of the fuse element 3. In FIG. 1A, a direction perpendicular to a direction connecting the terminals 3a and 3b is the width of the fuse element 3. In this embodiment, a case in which the fuse element 3 is formed of polysilicon is described as an example. It goes without saying that the present invention can be similarly carried out when a metal is used as a material of the fuse element 3.

An array of intersecting metal lines in the form of a lattice 5 formed of a metal is arranged above the fuse element 3 via an intermediate insulating film 4. The lattice 5 can be formed using, for example, a metal forming metal lines in a lowermost layer. As a matter of course, a metal forming metal lines in other layers may be used as well. In this embodiment, the lattice is a square lattice, and the intersecting metal lines form square windows 10 each having sides at a length of L. In this case, the length L of a side of the window 10 is shorter than a wavelength of laser light used for cutting the fuse element 3. This is for the purpose of confining the laser light radiated from a rear surface of the semiconductor substrate 1 toward the fuse element 3. The lattice is formed so as not to cover the entire surface in order that a portion of the fuse element 3 cut by the laser light has room for rapid expansion due to generated heat. Further, the lattice 5 deforms and thereby receives expansion and rupture of the cut portion as a plastic net.

A porous region 9 formed of a porous insulating film 8 is formed on the lattice 5. A silicon nitride film 6 having a uniform thickness is formed on an entire surface of the semiconductor device including above the porous region 9, for protecting a front surface of the semiconductor device. The silicon nitride film 6 is formed on an interlayer film 7 as well. There is no region in which the silicon nitride film 6 is opened around the fuse elements 3. As described below, the laser light for cutting the fuse element 3 is radiated from the rear surface of the semiconductor device, and thus, the silicon nitride film 6 can be formed on the entire surface of the region including the fuse elements 3.

Further, as illustrated in FIG. 1B, the field oxide film 2 having the plurality of fuse elements 3 formed thereon is formed on a front surface of the semiconductor substrate 1. Side surfaces and a top surface of the fuse elements 3 are covered with the intermediate insulating film 4. Further, side surfaces and a top surface of the lattice 5 are covered with the porous insulating film 8. In this embodiment, the porous insulating film 8 is selectively formed in the porous region 9.

The porous insulating film 8 is formed of, for example, a low-k material that can be used for the interlayer film 7 as well. When the porous insulating film 8 and the interlayer film 7 are formed of the same material, a step of forming the porous insulating film 8 on the lattice 5 is not a separate step, and thus, it is not necessary to form the porous region 9, which eases manufacture of the semiconductor device. It is also possible to arrange metal lines above the fuse elements 3.

The silicon nitride film 6 is formed on the porous insulating film 8 and on the interlayer film 7 across the entire surface of the semiconductor device including a region in which the fuse elements 3 are arranged. In general, only a pad region in which the semiconductor device is connected to the outside is not covered with the silicon nitride film 6. The silicon nitride film 6 has a uniform thickness both on the interlayer film 7 and on the porous region 9 in which the porous insulating film 8 having the fuse elements 3 arranged therebelow exists.

The lattice 5 not only confines the laser light but also serves as a monitor when the interlayer film 7 is partly removed by etching to leave a desired amount thereof. When the porous region 9 is formed by etching, through monitoring a metal forming the lattice 5, appropriate overetching can be carried out to remove the interlayer film 7. This can control the porous insulating film 8 formed above the fuse elements 3 to have a uniform thickness, which enables cutting conditions by the laser light to be constant.

Next, a method of cutting the fuse element 3 by the laser light is described.

In cutting the fuse element 3, laser light 11 for cutting the fuse element 3 is radiated from the rear surface of the semiconductor substrate 1 on which the semiconductor device is formed, the laser light 11 is controlled to be collected so that a focal point of the laser light 11 may be on the fuse element 3. A frequency of the laser light 11 is represented by ν. If energy hν of a photon is smaller than a band gap of the semiconductor substrate 1, the light is not absorbed, and thus, the laser light 11 can pass through the semiconductor substrate 1. However, if the laser light has a high intensity, the energy of a photon is an integral multiple of hν, which enables absorption thereof by the semiconductor substrate 1. This is action of light collection. The laser light 11 has a high intensity at the focal point, and in this case, is absorbed by the fuse element 3. The portion of the fuse element 3 to be cut that absorbs the laser light 11 generates heat, rapidly expands, and ruptures. In this way, the fuse element 3 is cut. Change in volume accompanying the expansion and the rupture is absorbed by the lattice 5 and the porous insulating film 8. Therefore, the expansion and the rupture do not affect the silicon nitride film 6.

When the semiconductor substrate 1 is formed of silicon, laser light having a wavelength of about 1,100 nm can pass through a silicon substrate having a thickness of about 500 μm. Though the field oxide film 2 exists between the semiconductor substrate 1 and the fuse element 3, it is known that an oxide film is generally transparent to a light of infrared light or visible light and only slightly absorbs light in this range, and therefore, no problem arises.

Further, the lattice 5 is a square lattice having square windows 10, but the shape of the windows is not limited to a square, and may be a rectangle having a longer side and a shorter side both equal to or shorter than the wavelength of the laser light 11.

In this way, a semiconductor device can be provided in which, through radiating the laser light 11 from the rear surface of the semiconductor substrate 1 to cut the fuse element 3, the fuse elements 3 are not exposed from the cut surface after the fuse element 3 is cut by the laser light 11.

Second Embodiment

Next, a semiconductor device according to a second embodiment of the present invention is described with reference to the drawings.

Figure 2:
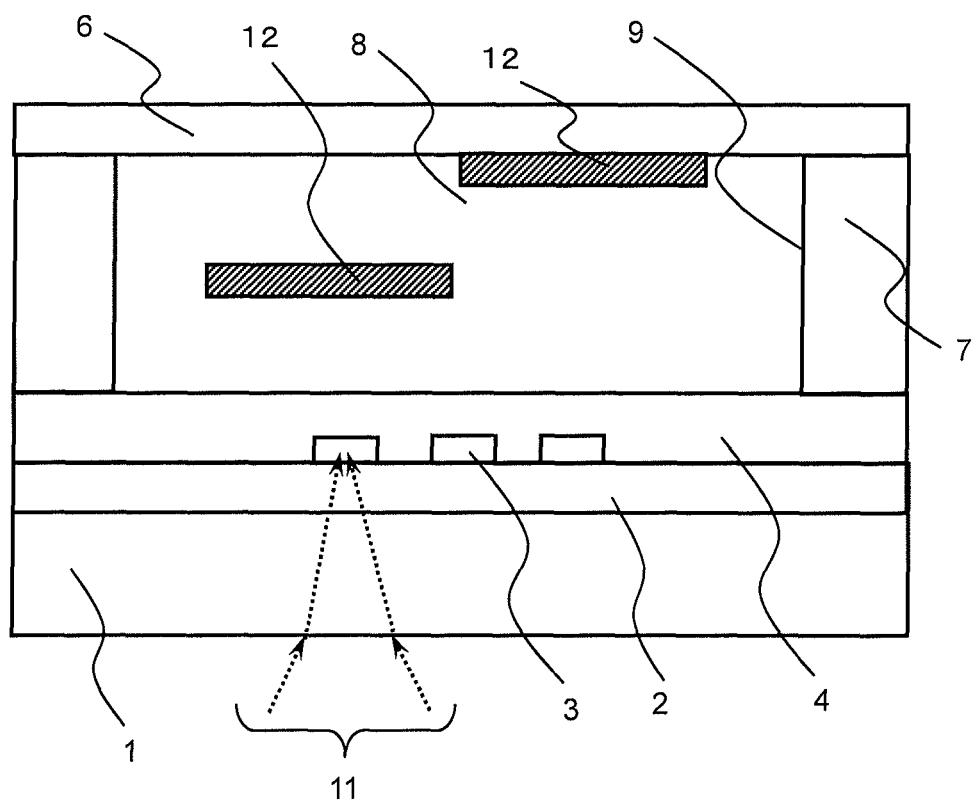
FIG. 2 is a sectional view for illustrating a semiconductor device according to a second embodiment of the present invention.

FIG. 2 is a sectional view of the semiconductor device according to the second embodiment of the present invention. Like reference numerals are used to designate like members illustrated in the sectional view of FIG. 1B. A different point is that the lattice 5 is not arranged. When collection of the laser light 11 from the rear surface of the semiconductor substrate 1 is sufficiently controlled and it is not necessary to cover an upper portion of the fuse elements 3 with the metal lattice 5, the metal lattice 5 may be omitted.

Instead of the metal lattice 5, metal lines 12 may be freely arranged above the fuse elements 3. As necessary, the metal line 12 may be a shield that completely covers the upper portion of the fuse elements 3. A method of cutting the fuse element 3 by the laser light 11 is the same as that in the first embodiment.

When the porous insulating film 8 and the interlayer film 7 are formed of different materials, if the lattice 5 is not arranged, it is difficult to accurately etch the interlayer film 7 in order to form the porous region 9. Thus, it is desired to form, in another region, a structure that allows monitoring of the etching. When the porous insulating film 8 and the interlayer film 7 are formed of the same material, it is not necessary to form the porous region 9 on the intermediate insulating film 4 that is in turn on the fuse elements 3, and thus, a separate step is not necessary, which eases the manufacture. It is also easy to arrange the metal line 12 above the fuse elements 3.

The porous insulating film 8, which is formed of, for example, a low-k material, has an affinity for the interlayer film 7 or other metal lines metals, and may thus be deposited on the entire surface of the semiconductor device. In order to prevent moisture from coming in, the porous insulating film 8 and the interlayer film 7 are covered with the silicon nitride film 6.

Third Embodiment

Figure 3:
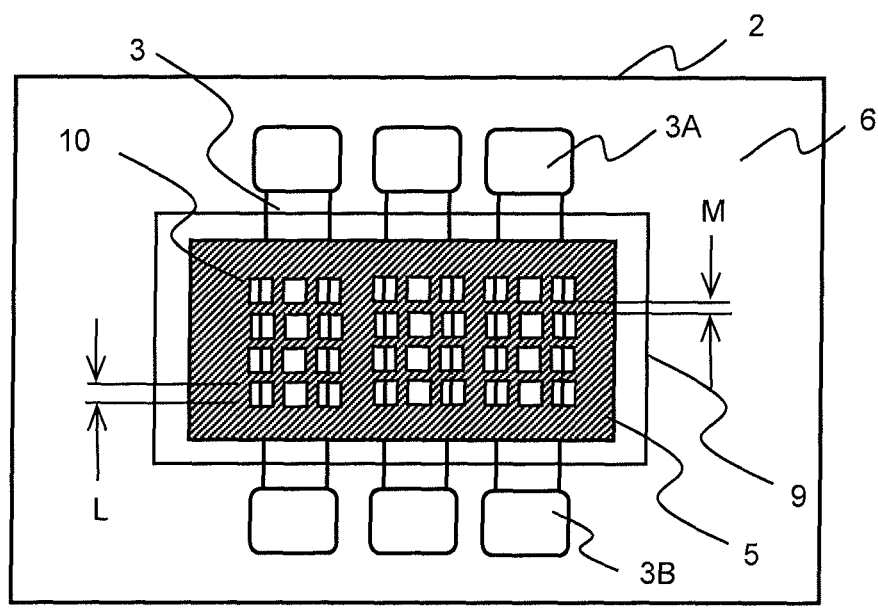
FIG. 3 is a plan view for illustrating a semiconductor device according to a third embodiment of the present invention.

FIG. 3 is a plan view for illustrating a semiconductor device according to a third embodiment of the present invention. In this embodiment, the lattice 5 is again used. This embodiment is different from the first embodiment in that the intersecting metal lines of the lattice 5 according to this embodiment form the windows 10 that are densely arranged above the fuse elements 3 compared with those in the first embodiment. This relatively reduces a window interval M that is a distance between adjacent windows 10. The windows 10 are rectangular, and have a longer side L that is shorter than the wavelength of the laser light used for cutting the fuse element 3. Determining the window interval M to be ½ to ¹/₁₀ of the longer side L of the windows 10 relatively reduces the window interval M, and, when the fuse element 3 is cut, the lattice 5 can be plastically deformed without restricting or inhibiting the expansion and the rupture of a portion of the fuse element 3 to which the laser light is radiated.

It is possible as well that the windows 10 are arranged in an entire surface of the lattice 5 with the window interval M being the same. This further facilitates the plastic deformation.

Fourth Embodiment

Figure 4:
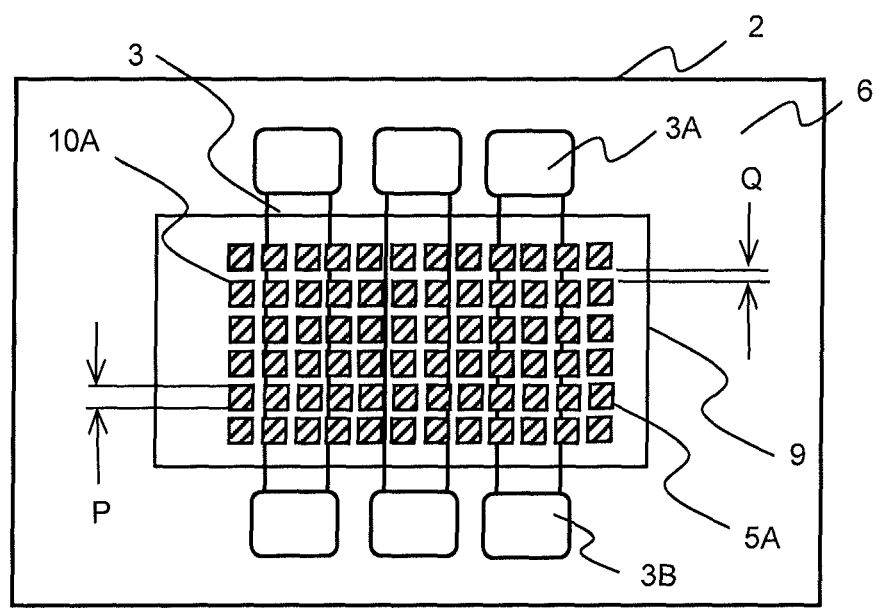
FIG. 4 is a plan view for illustrating a semiconductor device according to a fourth embodiment of the present invention.

FIG. 4 is a plan view for illustrating a semiconductor device according to a fourth embodiment of the present invention. According to this embodiment, an integral lattice is not formed, and instead, an array 5A is formed. The rest of the structure is similar to that in the first embodiment. The array 5A is formed of the same material as that of the lattice 5. In the array 5A, a plurality of independent light-shielding portions 10A are two-dimensionally arranged. According to this embodiment, each of the light-shielding portions 10A is in the shape of a rectangle having a longer side P. The light-shielding portions 10A are arranged in vertical and horizontal directions with an interval Q that is a distance between adjacent light-shielding portions 10A. The interval Q is shorter than the wavelength of the laser light used for cutting the fuse element 3. Thus, the laser light radiated from the rear surface of the semiconductor substrate cannot pass through the array 5A, and thus, does not affect the metal lines and the like existing on the front surface side of the semiconductor device.

Further, the light-shielding portions 10A are independent from one another, and thus, can be plastically deformed with ease by the expansion and the rupture of a portion of the fuse element 3 to which the laser light is radiated when the fuse element 3 is cut.

Note that, according to this embodiment, the light-shielding portions 10A having the same shape are arranged. However, in order not to form slit-like space between the light-shielding portions 10A, each of the light-shielding portions 10A can be in the shape of a triangle or a hexagon, or light-shielding portions having different shapes can be used in combination so that the light-shielding portions can be two-dimensionally repeatedly arranged, which are more effective.

As described above, a semiconductor device can be provided in which the upper portion of the fuse elements 3 is uniformly covered with the silicon nitride film 6.

What is claimed is:

1. A semiconductor device having a fuse element, comprising:
    a semiconductor substrate;
    a field insulating film formed on a front surface of the semiconductor substrate;
    a fuse element formed on the field insulating film;
    an intermediate insulating film covering a side surface and a top surface of the fuse element;
    a metal lattice formed on the intermediate insulating film and covering the fuse element, the metal lattice having a plurality of windows each of which has four sides;
    a porous insulating film formed around the metal lattice; and
    a silicon nitride film covering a surface of the porous insulating film.

2. A semiconductor device according to claim 1, wherein the windows comprise rectangular windows having opposed longer sides that are shorter than a wavelength of laser light to be irradiated on a rear surface of the semiconductor substrate to cut the fuse element.

3. A semiconductor device according to claim 2, wherein the rectangular windows are densely arranged above the fuse element.

4. A semiconductor device having a fuse element, comprising:
    a semiconductor substrate;
    a field insulating film formed on a front surface of the semiconductor substrate;
    a fuse element formed on the field insulating film;
    an intermediate insulating film covering a side surface and a top surface of the fuse element;
    a metal array formed on the intermediate insulating film and covering the fuse element, the metal array having a plurality of independent light-shielding portions each having a rectangular shape;
    a porous insulating film formed around the metal array; and
    a silicon nitride film covering a surface of the porous insulating film.

5. A semiconductor device according to claim 4, wherein the plurality of independent light-shielding portions are two-dimensionally arranged and spaced from one another at an interval that is shorter than a wavelength of laser light to be irradiated on a rear surface of the semiconductor substrate to cut the fuse element.

6. A semiconductor device according to claim 5, wherein the plurality of light-shielding portions are two-dimensionally repeatedly arranged.

7. A semiconductor device according to claim 5, wherein the plurality of light-shielding portions are two-dimensionally repeatedly arranged by combining a predetermined number of the plurality of light-shielding portions.

8. A semiconductor integrated circuit device, comprising:
a semiconductor substrate having front and rear surfaces;
a field insulating film disposed on the front surface of the semiconductor substrate;
fuse elements disposed in spaced-apart relationship on the field insulating film, each fuse element having two opposite end portions interconnected by a middle portion;
an intermediate insulating film formed on the fuse elements and covering top and side surfaces of the fuse elements;
an array of intersecting metal lines disposed over the intermediate insulating film and over the middle portions of the fuse elements, the intersecting metal lines defining therebetween a plurality of windows partly or completely overlying the middle portions of the fuse elements;
a porous insulating film formed around the intersecting metal lines and in the windows; and
a silicon nitride film disposed on the porous insulating film.

9. A semiconductor integrated circuit device according to claim 8; wherein some of the windows partly overlie the middle portions and others completely overlie the middle portions of the fuse elements.

10. A semiconductor integrated circuit device according to claim 9; wherein the windows have a rectangular shape.

11. A semiconductor integrated circuit device according to claim 10; wherein the windows have a square shape.

12. A semiconductor integrated circuit device according to claim 10; wherein the rectangularly-shaped windows have opposed longer sides and opposed shorter sides, the longer sides being shorter in length than a wavelength of laser light to be irradiated on the rear surface of the semiconductor surface to cut the middle portion of selected fuse elements.

13. A semiconductor integrated circuit device according to claim 8; wherein the array of intersecting metal lines comprises a metal lattice of intersecting metal lines.

14. A semiconductor integrated circuit device according to claim 13; wherein some of the windows partly overlie the middle portions and others completely overlie the middle portions of the fuse elements.

15. A semiconductor integrated circuit device according to claim 14; wherein the windows have a rectangular shape.

16. A semiconductor integrated circuit device according to claim 15; wherein the rectangularly-shaped windows have opposed longer sides and opposed shorter sides, the longer sides being shorter in length than a wavelength of laser light to be irradiated on the rear surface of the semiconductor surface to cut the middle portion of selected fuse elements.

17. A semiconductor integrated circuit device according to claim 16; wherein the interval between adjacent longer sides of each two adjacent windows overlying the middle portions of the fuse elements is ½ to ¹⁄₁₀ the length of the longer sides.

18. A semiconductor integrated circuit device according to claim 16; wherein the interval between adjacent longer sides of each two adjacent windows is ½ to ¹⁄₁₀ the length of the longer sides.

19. A semiconductor integrated circuit device according to claim 8; wherein the array of intersecting metal lines is disposed over the middle portions of the fuse elements but not over the end portions of the fuse elements.

* * * * *